(12) United States Patent
Yokokawa

(10) Patent No.: US 10,886,163 B2
(45) Date of Patent: Jan. 5, 2021

(54) METHOD FOR MANUFACTURING BONDED WAFER

(71) Applicant: SHIN-ETSU HANDOTAI CO., LTD., Tokyo (JP)

(72) Inventor: Isao Yokokawa, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/603,622

(22) PCT Filed: Feb. 27, 2018

(86) PCT No.: PCT/JP2018/007254
§ 371 (c)(1),
(2) Date: Oct. 8, 2019

(87) PCT Pub. No.: WO2018/198521
PCT Pub. Date: Nov. 1, 2018

(65) Prior Publication Data
US 2020/0203217 A1 Jun. 25, 2020

(30) Foreign Application Priority Data
Apr. 25, 2017 (JP) ................................. 2017-086381

(51) Int. Cl.
*H01L 21/762* (2006.01)
*H01L 21/265* (2006.01)

(52) U.S. Cl.
CPC ...... *H01L 21/76254* (2013.01); *H01L 21/265* (2013.01); *H01L 21/26586* (2013.01)

(58) Field of Classification Search
CPC ............. H01L 21/26586; H01L 21/265; H01L 21/76254
See application file for complete search history.

(56) References Cited

U.S. PATENT DOCUMENTS 5,374,564 A * 12/1994 Bruel ................ H01L 21/76243
438/455
2010/0006779 A1 1/2010 Aoki
(Continued)

FOREIGN PATENT DOCUMENTS

JP H02-123656 A 5/1990
JP 2006-324051 A 11/2006
(Continued)

OTHER PUBLICATIONS

Genshuu, Fuse et al., "Kokomade-kita Ion Chuunyuu Gijutsu", K Books Series 79, pp. 44-53, (1991).
(Continued)

*Primary Examiner* — Zandra V Smith
*Assistant Examiner* — John M Parker
(74) *Attorney, Agent, or Firm* — Oliff PLC

(57) ABSTRACT

A bonded wafer including an ion implantation step using a batch processing ion implanter, wherein the ion implantation step is performed by irradiating a bond wafer with a light element ion beam without forming an insulator film on the bond wafer surface or through an insulator film having a thickness of 50 nm or less formed on the bond wafer surface at an implantation angle inclined from a crystal axis of the bond wafer; and the bond wafer surface is irradiated with the center of the light element ion beam shining at a position on the bond wafer surface shifted from the center of the bond wafer parallel to the center of a rotor by a predetermined amount providing a bonded wafer to prevent degradation of the radial uniformity of ion implantation depth and manufacture a bonded wafer with excellent radial uniformity of thickness of a thin film after delamination.

2 Claims, 5 Drawing Sheets

(56) References Cited

U.S. PATENT DOCUMENTS

| | | | |
|---|---|---|---|
| 2013/0023069 A1 | 1/2013 | Yokokawa | |
| 2014/0097523 A1* | 4/2014 | Aga | H01L 21/68764 |
| | | | 257/632 |
| 2014/0329372 A1 | 11/2014 | Aga et al. | |
| 2015/0044798 A1* | 2/2015 | Hertkorn | H01L 21/76254 |
| | | | 438/33 |
| 2015/0118825 A1* | 4/2015 | Ishizuka | H01L 21/6875 |
| | | | 438/458 |
| 2016/0197007 A1 | 7/2016 | Yokokawa et al. | |
| 2017/0243747 A1* | 8/2017 | Brugger | H01L 22/12 |
| 2018/0286637 A1* | 10/2018 | Ochi | H01L 21/2236 |
| 2020/0152409 A1* | 5/2020 | Yagita | H01J 37/3171 |

FOREIGN PATENT DOCUMENTS

| | | |
|---|---|---|
| JP | 2010-015774 A | 1/2010 |
| JP | 2011-233651 A | 11/2011 |
| JP | 2012-248739 A | 12/2012 |
| JP | 2013-125909 A | 6/2013 |
| JP | 2014-011272 A | 1/2014 |
| JP | 2015-041666 A | 3/2015 |

OTHER PUBLICATIONS

May 15, 2018 International Search Report issued in International Patent Application No. PCT/JP2018/007254.

\* cited by examiner

METHOD FOR MANUFACTURING BONDED WAFER

TECHNICAL FIELD

The present invention relates to a method for manufacturing a bonded wafer using an ion implantation delamination method.

BACKGROUND ART

As one of semiconductor device wafers, there is an SOI (Silicon On Insulator) wafer having a silicon layer formed on a silicon oxide film, which is an insulator film. This SOI wafer has characteristics such as a small parasitic capacitance, a high radiation resistant capability, and others since a silicon layer (which may be referred to as an SOI layer hereinafter) of a substrate surface layer portion, which serves as a device fabrication region, is electrically separated from the inside of the substrate by a buried oxide film layer (a BOX layer). Therefore, effects such as a high-speed/low-power consumption operation, prevention of a soft error, and others are expected, and the SOI wafer is expected as a substrate for a high-performance semiconductor device.

As typical examples of a method for manufacturing an SOI wafer, a wafer bonding method and an SIMOX method may be exemplified. The wafer bonding method has an advantage of allowing the SOI layer and the BOX layer to be manufactured in any thickness, and is applicable to various devices thereby. Among the wafer bonding methods, particularly, an ion implantation delamination method makes it possible to yield device characteristics that are stable on an entire wafer surface.

In the ion implantation delamination method, however, ions are implanted into a single crystal material having crystal orientation, and some parts of the ions are implanted into deep positions thereby without considering channeling effect. This causes issues such as degradation of the uniformity of ion implantation depth and lowering of the concentration of implantation peak position to degrade the uniformity of film thickness after delamination or to make the delamination impossible.

As a countermeasure for these issues, for example, non-patent document 1 exemplifies a method of setting an ion implantation angle to 7° using such a silicon wafer of a single crystal material as having (100) orientation.

CITATION LIST

Patent Literature

Patent Document 1: Japanese Unexamined Patent Application Publication No. 2012-248739
Patent Document 2: Japanese Unexamined Patent Application Publication No. 2014-11272

Non Patent Literature

Non Patent Document 1: "Kokomade-kita ion chuunyuu gijutsu", Fuse Genshuu, Kougyo chosakai, 1991

SUMMARY OF INVENTION

Technical Problem

The use of a batch processing ion implanter, however, is troubled with degrading the radial uniformity of ion implantation depth even when channeling effect is considered and the implantation angle is inclined from the crystal axis of a wafer in the ion implantation.

The present invention was accomplished in view of the above-described issues. It is an object of the present invention to provide a method for manufacturing a bonded wafer that can prevent degradation of the radial uniformity of ion implantation depth in the ion implantation step, thereby making it possible to manufacture a bonded wafer that has excellent radial uniformity of thickness of a thin film after delamination.

Solution to Problem

To resolve the issues described above, the present invention provides a method for manufacturing a bonded wafer comprising:

an ion implantation step of ion implantation into a bond wafer from a surface of the bond wafer to form an ion implanted layer using a batch processing ion implanter, the batch processing ion implanter comprising a rotor and a plurality of wafer holders that are provided to the rotor and have substrates arranged thereon and implanting ions into the plurality of substrates that are arranged on the wafer holders and revolve;

a bonding step of bonding the ion implanted surface of the bond wafer to a surface of a base wafer directly or through an insulator film; and a delamination step of delaminating the bond wafer at the ion implanted layer, thereby manufacturing a bonded wafer having a thin film on the base wafer, wherein the ion implantation into the bond wafer is performed in the ion implantation step by irradiating the surface of the bond wafer with a beam of a light element ion without forming an insulator film on the surface of the bond wafer or through an insulator film having a thickness of 50 nm or less formed on the surface of the bond wafer at an implantation angle inclined from a crystal axis of the bond wafer; and the entire surface of the bond wafer is irradiated with the beam of a light element ion in such a way that the center of the beam of a light element ion shines at a position on the surface of the bond wafer shifted from the center of the bond wafer in a parallel direction with a direction to the center of the rotor by a predetermined amount.

The method for manufacturing a bonded wafer like this makes it possible to prevent degradation of the radial uniformity of ion implantation depth in the ion implantation step, thereby making it possible to prevent degradation of the radial uniformity of thickness of a thin film after delamination.

In this case, it is preferable that the light element ion be a hydrogen ion or a helium ion.

The inventive method for manufacturing a bonded wafer is particularly effective in ion implantation of these light element ions.

Advantageous Effect of Invention

The inventive method for manufacturing a bonded wafer makes it possible to prevent degradation of the radial uniformity of ion implantation depth in the ion implantation step, thereby making it possible to manufacture a bonded wafer with excellent radial uniformity of thickness of a thin film, particularly an SOI wafer with excellent radial uniformity of film thickness of an SOI layer after delamination.

DESCRIPTION OF EMBODIMENTS

Figure 3:
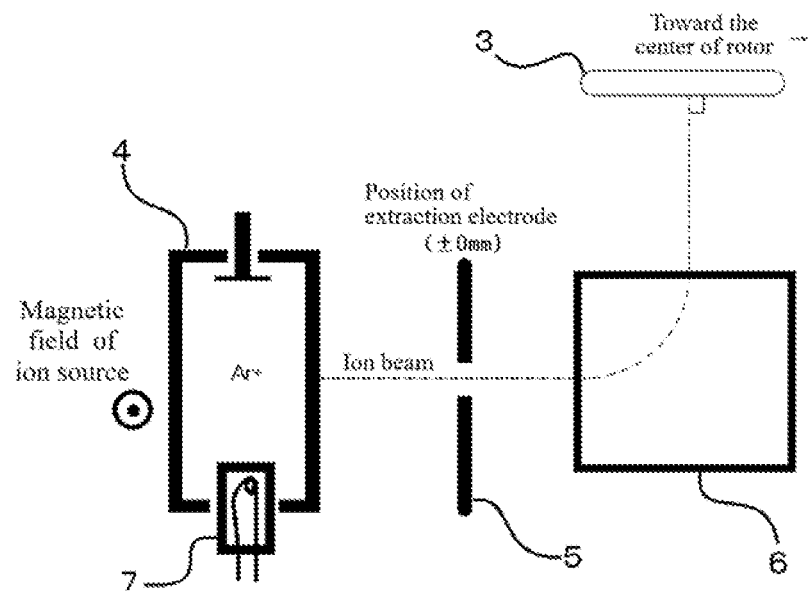
FIG. 3 is a drawing explaining the path of an ion beam in case of shining an Ar ion beam in ion implantation.

In an ion implantation step using a wafer with an off-angle as a bond wafer to avoid channeling effect, for example, and irradiating the wafer with a beam of an ion other than light element ions, such as an Ar ion beam to implant the ions vertically to the wafer surface, the beam is extracted from the ion source 4 having the filament 7 as shown in FIG. 3, and the extraction electrode 5 to extract the beam is disposed at the position nearly central to the ion source 4. The ion beam extracted with the extraction electrode 5 is introduced to the mass spectrograph 6, and then, the path is curved approximately vertically by the magnetic field in the mass spectrograph so as to coincide the center of the ion beam with the center of the wafer 3 arranged on a wafer holder on the outside of the mass spectrograph. As a result, the ion beam shines at the center of the wafer vertically.

Figure 4:
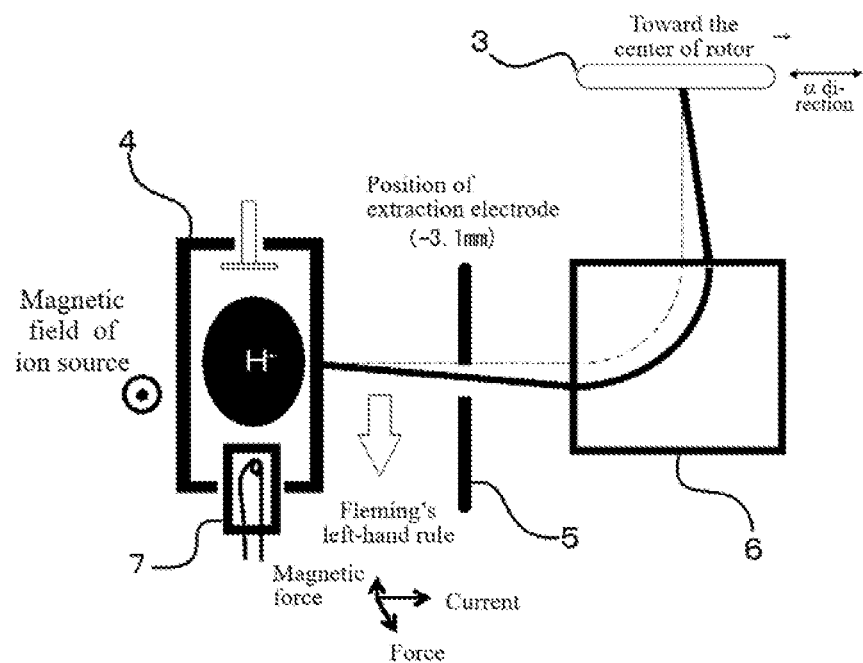
FIG. 4 is a drawing explaining the previous path of an ion beam in case of shining a light element ion beam in ion implantation.

On the other hand, in case of implanting a light element ion, such as a hydrogen ion as shown in FIG. 4, the ion beam extracted from the ion source 4 results to travel a path that is slightly swerved due to an influence of the magnetic field of the ion source because the light element ion is light. Accordingly, the position of the extraction electrode is adjusted (in FIG. 4, it is moved downwardly by 3.1 mm) to prevent the ion beam from colliding against the extraction electrode 5 to lower the current of the beam.

After introducing the ion beam into the mass spectrograph 6 along the path that is swerved slightly as described above, the path is altered usually by the magnetic field in the mass spectrograph so as to coincide the center of the ion beam with the center of the wafer 3 arranged on a wafer holder on the outside of the mass spectrograph. In case of altering the path so as to coincide the center of the ion beam with the center of the wafer 3 as described above, the ion beam does not shine at the center of a wafer vertically as shown in FIG. 4, but comes to shine at a slight angle corresponding to the degree that has been swerved by the magnetic field of the ion source.

As described above, in case of implanting light element ions such as a hydrogen ion with a batch processing ion implanter, the ion beam extracted from the ion source is influenced by the magnetic field of the ion source to swerve the path slightly and is implanted into a wafer at a slightly swerved angle thereby.

The present inventor has found that this angle deviation influences the channeling in ion implantation using a batch processing ion implanter without forming an insulator film or after forming a thin insulator film on the surface of a bond wafer composed of a single crystal, thereby resulting in degrading the radial uniformity of ion implantation depth (the radial uniformity of thickness of thin film after delamination).

The present inventor has further investigated to resolve the issues to find that light element ions can be implanted without causing degradation of the radial uniformity of ion implantation depth (the radial uniformity of thickness of thin film after delamination) by performing the ion implantation into the entire surface of a bond wafer in a condition for shining the ion beam at a position shifted from the center of the bond wafer; thereby bringing the present invention to completion.

That is, the present invention provides a method of manufacturing a bonded wafer comprising:

an ion implantation step of ion implantation into a bond wafer from a surface of the bond wafer to form an ion implanted layer using a batch processing ion implanter equipped with a rotor and a plurality of wafer holders mounted on the rotor to hold substrates arranged thereon to implant ions into the plurality of substrates that are arranged on the wafer holders to revolve;

a bonding step of bonding the surface from which the ion implantation has been performed on the bond wafer and a surface of a base wafer directly or through an insulator film; and a delamination step of delaminating the bond wafer at the ion implanted layer, thereby manufacturing a bonded wafer having a thin film on the base wafer, wherein the ion implantation into the bond wafer is performed in the ion implantation step by irradiating the surface of the bond wafer with a beam of a light element ion without forming an insulator film on the surface of the bond wafer or through an insulator film having a thickness of 50 nm or less formed on the surface of the bond wafer at an implantation angle inclined from a crystal axis of the bond wafer; and the entire surface of the bond wafer is irradiated with the beam of a light element ion in such a way that the center of the beam of a light element ion shines on the surface of the bond wafer at a position shifted from the center of the bond wafer in a parallel direction with a direction to the center of the rotor by a predetermined amount.

Hereinafter, the inventive method for manufacturing a bonded wafer will be described.

Figure 2:
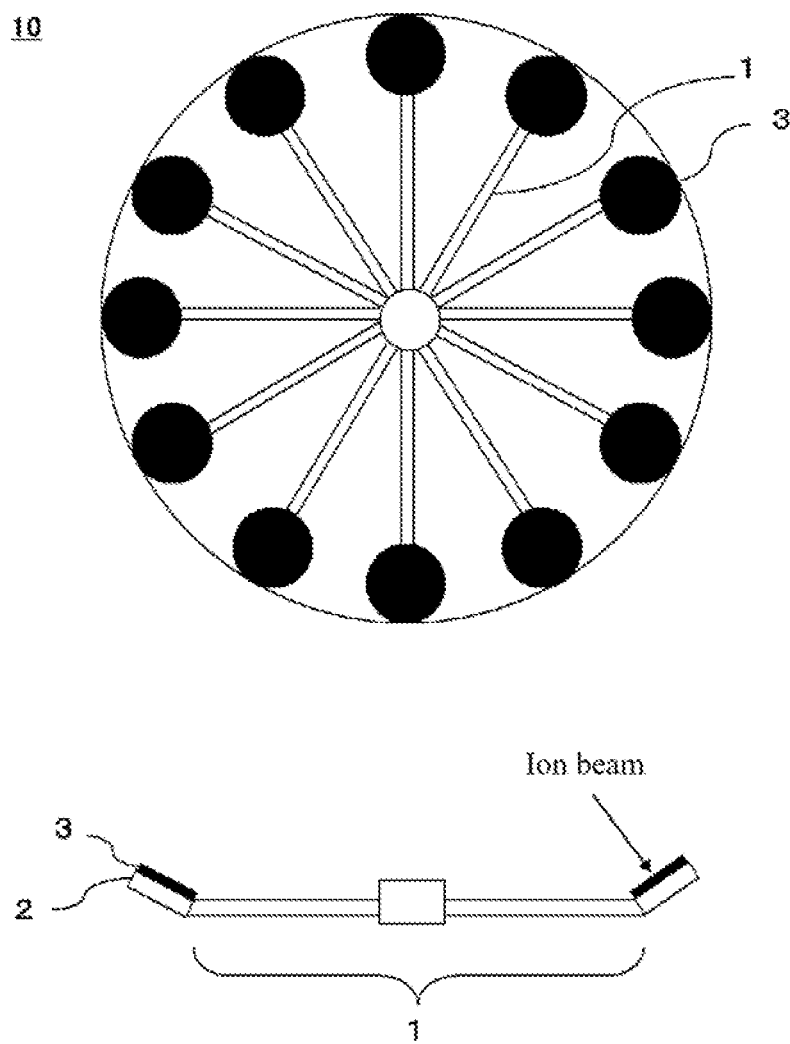
FIG. 2 is a schematic diagram showing an example of a batch processing ion implanter used in the present invention.

In the inventive method for manufacturing a bonded wafer, a batch processing ion implanter is used in the ion implantation step. As shown in FIG. 2, the batch processing ion implanter 10 is equipped with a rotor 1, together with a plurality of wafer holders 2 that are mounted on the rotor 1 to hold substrates (bond wafers) 3 arranged thereon, and is configured to implant ions into the plurality of substrates (bond wafers) 3 that are arranged on the wafer holders 2 and revolving.

With such a batch processing ion implanter, light element ions are implanted from the surface of a bond wafer to form an ion implanted layer. The bond wafer for ion implantation may be freely selected in accordance with the object and is not particularly limited. For example, the use of a silicon single crystal wafer makes it possible to manufacture an SOI wafer having an SOI layer that is excellent in radial uniformity of the film thickness.

In the ion implantation step of the present invention, ion implantation into the bond wafer is performed without forming an insulator film on the surface of the bond wafer or through an insulator film having a thickness of 50 nm or less formed on the surface of the bond wafer. As the insulator film, a silicon oxide film may be exemplified, for example. The insulator film formed on a bond wafer is not particularly limited in the lower limit of the thickness, and may be thicker than 0 nm.

Illustrative examples of the light element ion implanted from the surface of a bond water include a hydrogen ion ($H^+$), a hydrogen molecular ion ($H_2^+$), a helium ion ($He^+$), and a deuterium ion ($D^+$). Particularly, a hydrogen ion and a helium ion are preferable.

As described above, in the previous cases of implanting light element ions, the ion beam usually shines along the path that is curved by the magnetic field in the mass spectrograph as shown in FIG. 4 so as to coincide the center of the ion beam with the center of the bond wafer 3 arranged on a wafer holder on the outside of the mass spectrograph. Accordingly, the ion beam does not shine at the center of the wafer vertically, but shines at it slightly angled at a degree that has been swerved with the magnetic field of the ion source.

Figure 1:
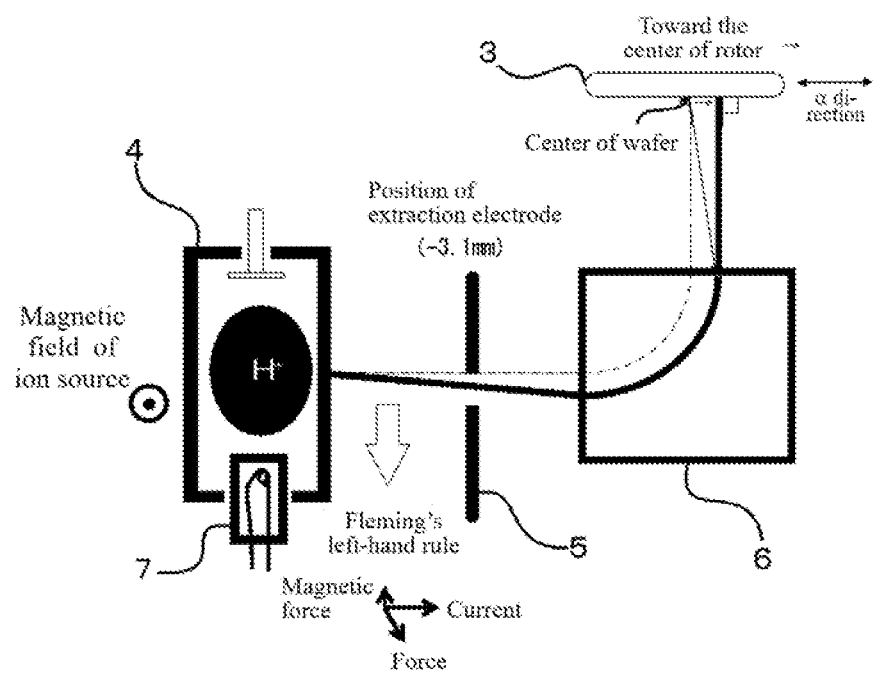
FIG. 1 is a drawing explaining the position of the center of a light element ion beam in the ion implantation step of the inventive method for manufacturing a bonded wafer.

On the other hand, the present invention is characterized by the ion implantation step, in which the ion implantation is performed as shown in FIG. 1 to irradiate the entire surface of the bond wafer 3 with a light element ion beam such that the center of the light element ion beam shines at a position on the surface of the bond wafer 3 shifted from the center of the bond wafer 3 in a parallel direction with a direction to the center of the rotor by a predetermined amount.

In the implantation of light element ions described above, the ions are implanted into the entire surface of the bond wafer such that the center of the ion beam shines at a position on the surface of the bond wafer 3 shifted from the center of the bond wafer 3 in a parallel direction with a direction to the center of the rotor by a predetermined amount, thereby making it possible to implant ions at any desired angle and to prevent degradation of the radial uniformity of ion implantation depth (the radial uniformity of thickness of thin film after delamination).

In the present invention, ion implantation is performed by inclining the implantation angle of the light element ion beam from the crystal axis of a bond wafer. The below describes relationship between the angle deviation in FIG. 4 and the inclination of implantation angle (hereinafter, referred to as the angle of inclination) with the crystal axis of a wafer for ion implantation (a bond wafer).

In case of using a wafer having a crystal orientation of precisely <100> (without an off-angle) as a bond wafer, for example, the ion implantation is usually performed by having an angle of inclination (e.g., at 7°) to the wafer surface in order to avoid channeling effect.

This angle of inclination is adjusted by inclining the wafer holder mounted on the rotor to the ion beam such that the angle is adjusted so as to incline at least one direction of the direction to the center of the rotor ($\alpha$ direction) and the vertical direction thereto, which is the direction of the circumference of the rotor ($\beta$ direction), on the wafer surface.

The angle deviation in FIG. 4 is a swerve in the $\alpha$ direction. Accordingly, in case of ion implantation forming the angle of inclination in the $\beta$ direction only, the implantation angle in the $\alpha$ direction can be adjusted to vertical to the wafer surface as in FIG. 1 by adjusting the center of a light element ion beam to shine at a position on the surface of the bond wafer shifted from the center of the bond wafer in a parallel direction with a direction to the center of the rotor by a predetermined amount, and this makes it possible to resolve the angle deviation due to the light element ion.

On the other hand, in case of ion implantation forming the angle of inclination in the $\alpha$ direction (the angle of inclination in the $\alpha$ direction is $\alpha$), the implantation angle in the $\alpha$ direction can be adjusted to coincide with the angle of inclination of (90−$\alpha$) degree to the wafer surface by adjusting the center of a light element ion beam to shine at a position on the surface of the bond wafer shifted from the center of the bond wafer in a parallel direction with $\alpha$ direction to the center of the rotor by a predetermined amount.

It is to be noted that the angle deviation which cause cone angle effect described in Patent Documents 1 and 2 generates in the $\beta$ direction.

Specifically, the wafer holder 2 in the batch processing ion implanter 10 is usually inclined slightly inward from the rotation plane of the rotor 1 as shown in FIG. 2 in order to hold the substrate 3. This allows the rotator 1, when it is rotating, to generate centrifugal force in rotating to effect force to press the substrate 3 against the wafer holder 2, whereby the wafer holder 2 holds the substrate 3. When the rotation plane of the rotor 1 is not parallel to the surface of the substrate 3 as described above, however, the center of the substrate and the both ends of the substrate in the direction of beam scan have implantation angles that are slightly different with each other in accordance with rotation of the rotor even if the ion beam is tried to be implanted into the substrate 3 at a constant angle. This makes the ion implantation depth deeper at the central part of the substrate and shallower at the both ends of the substrate in the scanning direction. This is called cone angle effect.

Accordingly, when the angle of inclination (e.g., 7°) in ion implantation is formed only in the $\beta$ direction using a batch processing ion implanter, for example, the swerve of implantation angle in the $\alpha$ direction, which is not vertical as in FIG. 4, causes to degrade the radial uniformity of ion implantation depth due to influences of channeling effect and cone angle effect. Thus the degradation of the radial uniformity of ion implantation depth is prevented by resolving the angle deviation due to a light element ion as described above.

In case of ion implantation performed vertically to the wafer surface (i.e., in case of implantation without inclining in both of the $\alpha$ direction and the $\beta$ direction) using a wafer with an off-angle as a bond wafer in order to avoid channeling effect, the implantation angle in the $\alpha$ direction can be adjusted to vertical to the wafer surface (and vertical also in the $\beta$ direction) by adjusting the center of a light element ion beam to shine at a position on the surface of the bond wafer shifted from the center of the bond wafer in a parallel direction with a direction to the center of the rotor by a predetermined amount, and this makes it possible to resolve the angle deviation due to the light element ion. Accordingly, the implantation is performed on a wafer at an implantation angle in accordance with the off-angle.

In order to shine the center of a light element ion beam at a position on the surface of the bond wafer 3 shifted from the center of the bond wafer 3 in a parallel direction with a direction to the center of the rotor by a predetermined amount, the beam may be shifted in the peak position by adjusting the current applied to a magnet to form the magnetic field in the mass spectrograph 6.

Figure 5:
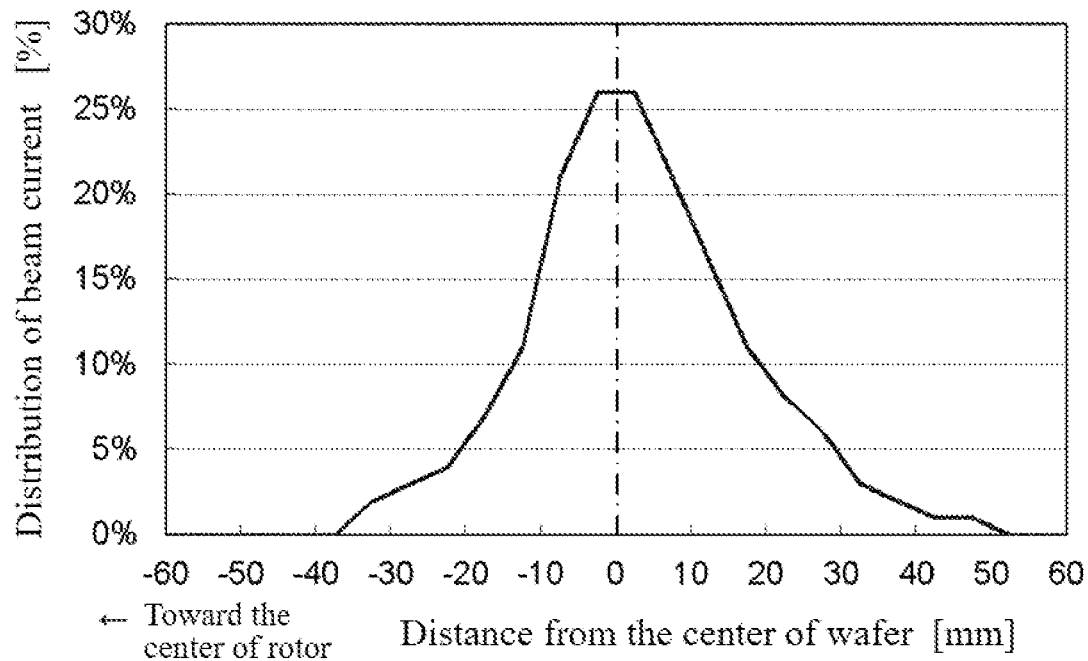
FIG. 5 is a graph explaining previous ion implantation regarding the distribution of current of a $H^+$ ion beam on a wafer surface in a parallel direction with a direction to the center of the rotor.

For example, in case of $H^+$ ion beam having an ion beam shape as in FIG. 5, ion implantation has been performed previously by setting the position of an ion beam in such a way that the peak position of the ion beam corresponds to the center of a wafer.

Figure 6:
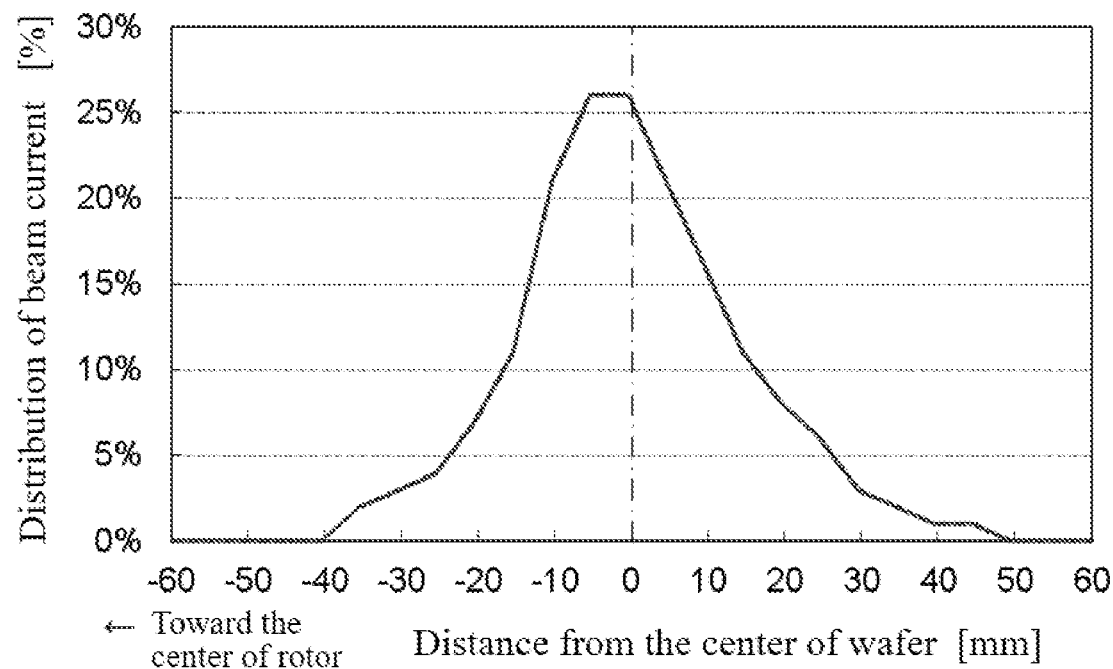
FIG. 6 is a graph explaining the ion implantation step of the present invention regarding the distribution of current of a $H^+$ ion beam on a wafer surface in a parallel direction with a direction to the center of the rotor.

In the present invention, the position of a $H^+$ ion beam is adjusted in such a way that the center of the $H^+$ ion beam shines at a position on the surface of the bond wafer shifted from the center of the bond wafer 3 in a parallel direction with a direction to the center of the rotor by a predetermined amount as in FIG. 6.

There is no way, however, to directly observe whether the ion beam is shifted on the surface of a bond wafer in an appropriate amount. Accordingly, the appropriate amount of shifting can be determined by producing bonded SOI wafers using bond wafers into which ions have been implanted by changing the amount to shift the position irradiated with the center of the ion beam from the center of the bond wafer using a wafer bonding methods (an ion implantation delamination method), followed by comparing the radial uniformity of each SOI layer.

In this case, the optimum amount of shifting is an amount to yield radial uniformity of the SOI layer, and falls to an amount of shifting to form a desirable implantation angle of ions. That is, in case of a silicon wafer with (100) orientation, for example, the position is shifted in such a way that an ion beam shines at the position so as to form a desired angle (e.g., 7°) in one direction.

The bonding step in the present invention is performed by bonding the ion implanted surface of a bond wafer and the surface of a base wafer directly or through an insulator film. The applicable base wafer includes a silicon single crystal wafer, but not particularly limited thereto.

Then, the bond wafer is delaminated at the ion implanted layer to manufacture a bonded wafer having a thin film on the base wafer. For example, the bond wafer can be delaminated at the ion implanted layer by heat treatment at a temperature of about 500° C. or more in an inert gas atmosphere. Alternatively, it can be delaminated by previously performing plasma treatment on the bonding surface at an ordinary temperature, and by applying external force without performing heat treatment (or after performing heat treatment that does not cause delamination).

The inventive method for manufacturing a bonded wafer like this makes it possible to prevent degradation of the radial uniformity of thickness of a thin film after delamination.

Incidentally, the mechanism has not been clarified for degrading the radial uniformity of ion implantation depth in ion implantation of light element ions that are implanted at a slightly diverged angle.

Still, the present inventor has researched on implantation of light element ions by comparing the case of implantation into the surface of a bond wafer composed of a single crystal without forming an insulator film and the case of implantation through an insulator film having a sufficient thickness (a thickness sufficient to avoid channeling effect, e.g., 100 nm or more), and has experimentally proved that the former comes to have a position of irradiation that shows a minimum value of radial uniformity by adjusting the position irradiated with the center of ion beam to be shifted from the center of a bond wafer by a predetermined amount, but the latter does not yields such a minimum value (has almost constant radial uniformity). Hereinafter, Experimental Examples 1 and 2 will be shown as experiments performed by the present inventor.

Experimental Example 1

Bond wafers were prepared using hydrogen ion beams having beam shapes in FIGS. 5 and 6 (the angle of inclination: 7° in the β direction) and by adjusting the current applied to a magnet to form a magnetic field in the mass spectrograph to control each wafer to change the shifting of the peak position of the ion beam from the center of the wafer, thereby implanting a predetermined amount of ions into each wafer (silicon single crystal wafer with a crystal orientation of <100> without having an off-angle nor a surface oxide film).

Each of these bond wafers was bonded to a base wafer (silicon single crystal wafer with a crystal orientation of <100> having a surface oxide film) and then delaminated at the ion implanted layer to produce a bonded SOI wafer, followed by measuring the radial distribution of film thickness of the SOI layer (film thickness range). The results are shown in FIG. 7.

Figure 7:
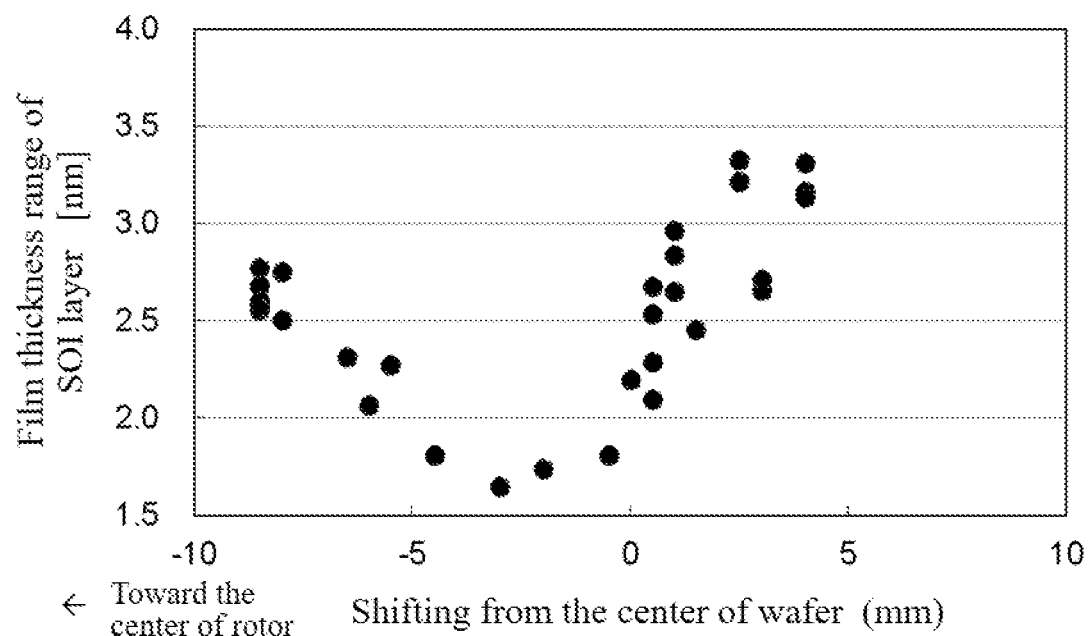
FIG. 7 is a graph showing results of measuring the radial distribution of film thickness (film thickness range) of an SOI layer in Experimental Example 1.

FIG. 7 shows that the film thickness range of the SOI layer becomes minimum when the peak position of the ion beam is shifted from the center of the wafer by about −3 mm (about 3 mm in α direction from the center of the wafer to the center of a rotor). This indicates that the angle deviation in the α direction becomes nearly 0 at the vicinity of −3 mm (about 3 mm in a direction from the center of the wafer to the center of a rotor), and the peak position of ion beam is adjusted to a position at which the implantation angle in the α direction becomes vertical to the wafer surface.

Experimental Example 2

Bond wafers for ion implantation were prepared using silicon single crystal wafers each having a surface oxide film (with a crystal orientation of <100> without having an off-angle, the oxide film: 200 nm) by adjusting each wafer to change the shift of the peak position of the ion beam from the center of the wafer in the same way as in Experimental Example 1, thereby implanting a predetermined amount of ions into each wafer.

Each of these bond wafers was bonded to a base wafer (silicon single crystal wafer with a crystal orientation of <100> without having a surface oxide film) and then delaminated at the ion implanted layer to produce a bonded SOI wafer, followed by measuring the radial distribution of film thickness of the SOI layer (film thickness range). The results are shown in FIG. 8.

Figure 8:
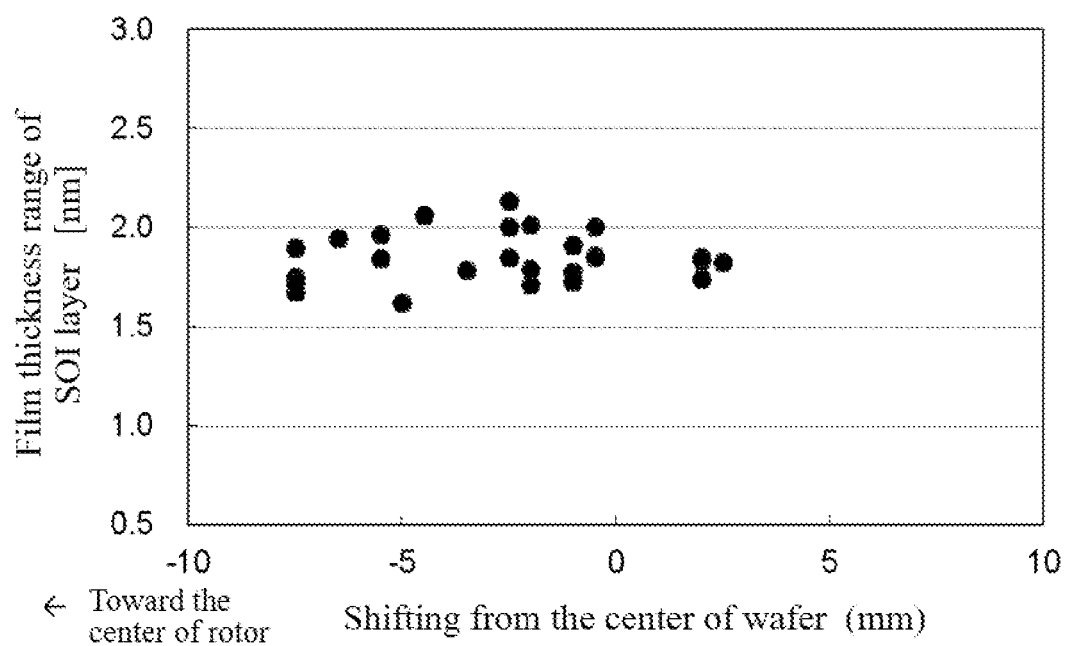
FIG. 8 is a graph showing results of measuring the radial distribution of film thickness (film thickness range) of an SOI layer in Experimental Example 2.

As shown in FIG. 8, in case of forming an oxide film with a thickness sufficient to avoid channeling effect and implanting ions therethrough into a bond wafer, the film thickness range of SOI layer shows nearly constant value without depending on the shifting from the center of a wafer.

From these experimental results, it is conceivable that the variation of radial uniformity in Experimental Example 1 be related to channeling effect. That is, it is presumed that channeling effect is partially promoted in some areas formed by complicated overlapping of a slight swerve of implantation angle, the angle of inclination to avoid channeling effect, and a swerve of implantation angle to cause cone angle effect that is peculiar to a batch processing ion implanter, thereby resulting in degradation of radial uniformity of ion implantation depth. Accordingly, the present invention is essential in case of ion implantation into a bond wafer without forming an insulator film on the surface of the bond wafer or through such a thin insulator film as having a thickness of 50 mm or less formed on the surface, in which channeling effect occurs.

Incidentally, it has been recently proposed to control the threshold voltage of a device by giving a bias to a BOX layer (a buried oxide film layer), which is used for insulation from a base wafer usually. In this case, it is necessary to produce a thin film SOI wafer of a Thin BOX type, in which the film thickness of the BOX layer is thinned. The present invention is useful for these cases, for example.

EXAMPLES

Hereinafter, the present invention will be more specifically described by showing Examples and Comparative Examples, but the present invention is not limited to these Examples.

Under the following conditions, an ion implanted layer was formed on a bond wafer using a batch processing ion implanter shown in FIG. 2, the ion implanted surface of the bond wafer was bonded to the surface of a base wafer through an oxide film, and the bond wafer was delaminated at the ion implanted layer to produce a bonded SOI wafer to measure the thickness range of the SOI film.

Example 1, Comparative Example 1

(Bond Wafer)
Si single crystal wafer, diameter: 300 mm, <100>, having no off-angle nor an oxide film
(Base Wafer)
Si single crystal wafer, diameter: 300 mm, <100>, having a thermal oxide film of 500 nm
(Conditions of Ion Implantation)
Ion to be implanted: $H^+$ ion, 50 keV, $5 \times 10^{16}/cm^2$
Beam shape: the same as in Experimental Examples
Angle of inclination of the beam: 7° in the β direction
Amount of shifting the center of beam from the center of a wafer: [Example 1: −3 mm (about 3 mm in a direction from the center of the wafer to the center of a rotor), [Comparative Example 1: 0 mm]
(Delamination heat treatment) 500° C., 30 minutes, Ar atmosphere
(Measurement of SOI film thickness) a measuring device: Acumap manufactured by ADE Corporation
(Measurement results) range of SOI film thickness: [Example 1: 1.6 nm], [Comparative Example 1: 2.2 nm]

Example 2, Comparative Example 2

(Bond Wafer)
Si single crystal wafer, diameter: 300 mm, <100>, having no off-angle, having an oxide film of 50 nm
(Base Wafer)
Si single crystal wafer, diameter: 300 mm, <100>, having no oxide film (Conditions of Ion Implantation)
Ion implanter: the same as in Example 1
Ion to be implanted: $H^+$ ion, 50 keV, $5 \times 10^{16}/cm^2$
Beam shape: the same as in Experimental Examples
Angle of inclination of the beam: 7° in the β direction
Amount of shifting the center of beam from the center of a wafer: [Example 2: −3 mm (about 3 mm in α direction from the center of the wafer to the center of a rotor), [Comparative Example 2: 0 mm]
(Measurement of SOI film thickness) a measuring device: Acumap manufactured by ADE Corporation
(Measurement results) range of SOI film thickness: [Example 2: 1.7 nm], [Comparative Example 2: 2.4 nm]

From the results described above, Examples 1 and 2 resulted to produce SOI wafers having lower SOI film thickness range, that is, being excellent in radial uniformity compared to Comparative Examples 1 and 2.

It is to be noted that the present invention is not restricted to the foregoing embodiment. The foregoing embodiment is just an illustrative example, and any example that has substantially the same configuration and exercises the same functions and effects as the technical concept described in claims is included in the technical scope of the present invention.

The invention claimed is:

1. A method for manufacturing a bonded wafer comprising:
   an ion implantation step of ion implantation into a bond wafer from a surface of the bond wafer to form an ion implanted layer using a batch processing ion implanter, the batch processing ion implanter comprising a rotor and a plurality of wafer holders that are provided to the rotor and have substrates arranged thereon and implanting ions into the plurality of substrates that are arranged on the wafer holders and revolve;
   a bonding step of bonding the ion implanted surface of the bond wafer to a surface of a base wafer directly or through an insulator film; and
   a delamination step of delaminating the bond wafer at the ion implanted layer, thereby manufacturing a bonded wafer having a thin film on the base wafer,
   wherein the ion implantation into the bond wafer is performed in the ion implantation step by irradiating the surface of the bond wafer with a beam of a light element ion without forming an insulator film on the surface of the bond wafer or through an insulator film having a thickness of 50 nm or less formed on the surface of the bond wafer at an implantation angle inclined from a crystal axis of the bond wafer; and
   the entire surface of the bond wafer is irradiated with the beam of a light element ion in such a way that the center of the beam of a light element ion shines at a position on the surface of the bond wafer shifted from the center of the bond wafer in a parallel direction with a direction to the center of the rotor by a predetermined amount.

2. The method for manufacturing a bonded wafer according to claim 1, wherein the light element ion is a hydrogen ion or a helium ion.

* * * * *